(12) United States Patent
Kobayashi et al.

(10) Patent No.: US 12,363,973 B2
(45) Date of Patent: Jul. 15, 2025

(54) SiC WAFER AND MANUFACTURING METHOD THEREOF

(71) Applicant: Proterial, Ltd., Tokyo (JP)

(72) Inventors: Keisuke Kobayashi, Tokyo (JP); Akio Shima, Tokyo (JP)

(73) Assignee: Proterial, Ltd., Tokyo (JP)

( * ) Notice: Subject to any disclaimer, the term of this patent is extended or adjusted under 35 U.S.C. 154(b) by 882 days.

(21) Appl. No.: 17/183,549

(22) Filed: Feb. 24, 2021

(65) Prior Publication Data

US 2021/0280677 A1    Sep. 9, 2021

(30) Foreign Application Priority Data

Mar. 5, 2020  (JP) .................... 2020-037757

(51) Int. Cl.
| | | |
|---|---|---|
| H01L 21/02 | (2006.01) | |
| H01L 21/04 | (2006.01) | |
| H10D 12/01 | (2025.01) | |
| H10D 30/66 | (2025.01) | |
| H10D 62/832 | (2025.01) | |

(52) U.S. Cl.
CPC ... *H10D 62/8325* (2025.01); *H01L 21/02378* (2013.01); *H01L 21/02447* (2013.01); *H01L 21/02529* (2013.01); *H01L 21/0262* (2013.01); *H01L 21/0445* (2013.01); *H10D 12/031* (2025.01); *H10D 30/66* (2025.01)

(58) Field of Classification Search
CPC ............... C30B 29/36; H01L 29/1608; H01L 29/66053; H01L 29/066068; H01L 21/02529; H01L 21/02378; H01L 21/02447; H01L 2924/10272
See application file for complete search history.

(56) References Cited

U.S. PATENT DOCUMENTS

| | | | |
|---|---|---|---|
| 6,133,120 | A | 10/2000 | Miyajima et al. |
| 8,124,510 | B2 | 2/2012 | Kawada et al. |
| 8,823,015 | B2 | 9/2014 | Momose et al. |
| 10,329,689 | B2 | 6/2019 | Masumoto |
| 2009/0302328 | A1 | 12/2009 | Ohno et al. |
| 2010/0247801 | A1 | 9/2010 | Zenasni |
| 2011/0070723 | A1 | 3/2011 | Kawada et al. |
| 2014/0353684 | A1* | 12/2014 | Kim ............... C30B 25/165 117/88 |

(Continued)

FOREIGN PATENT DOCUMENTS

| | | |
|---|---|---|
| JP | H09-063968 A | 3/1997 |
| JP | 2003-282451 A | 10/2003 |

(Continued)

OTHER PUBLICATIONS

"Effects of C/Si ratio in fast epitaxial growth of 4H-SiC(0001) by vertical hot-wall chemical vapor deposition" by H. Fujiwara et al. in Journal of Crystal Growth 281 (2005) 370-37 (Year: 2005).*

(Continued)

*Primary Examiner* — Eric A. Ward
(74) *Attorney, Agent, or Firm* — Volpe Koenig

(57) ABSTRACT

A SiC wafer including a SiC substrate and an epitaxial layer formed on the SiC substrate and containing SiC is provided, and a composition ratio of C—Si of an upper surface of the epitaxial layer is 50 atm % or less.

4 Claims, 14 Drawing Sheets

(56) References Cited

U.S. PATENT DOCUMENTS

| | | | |
|---|---|---|---|
| 2016/0111499 A1 | 4/2016 | Hisamoto et al. | |
| 2018/0096854 A1 | 4/2018 | Wada et al. | |
| 2020/0006066 A1 | 1/2020 | Konishi et al. | |
| 2020/0263295 A1* | 8/2020 | Miyahara | H01L 21/0262 |
| 2022/0220635 A1* | 7/2022 | Leow | C30B 25/10 |

FOREIGN PATENT DOCUMENTS

| | | | |
|---|---|---|---|
| JP | 2007-137689 A | 6/2007 | |
| JP | 2009-239103 A | 10/2009 | |
| JP | 2009-295728 A | 12/2009 | |
| JP | 2010-258294 A | 11/2010 | |
| JP | 2012-142597 A | 7/2012 | |
| JP | 2013-118242 A | 6/2013 | |
| JP | 2014-205894 A | 10/2014 | |
| JP | 2015-143168 A | 8/2015 | |
| WO | 2015/159949 A1 | 10/2015 | |
| WO | 2016/185819 A1 | 11/2016 | |
| WO | 2018/150861 A1 | 11/2019 | |

OTHER PUBLICATIONS

"Investigation of structural and chemical ordering in Si-rich amorphous SiC alloys via Raman spectroscopy and numerical modelling" by A Chehaidar et al. in J. Phys: Condens. Matter 13 (2001) 10743-10755 (Year: 2001).*

"High quality 4H—SiC homo-epitaxial wafer using the optical C/Si ratio" by L.X. Zhao et al. in Journal of Crystal Growth 530 (2020) 125302 available online Oct. 18, 2019 (Year: 2019).*

"Identification and tackling of parasitic surface compound in SiC and Si-rich carbide films" by M. Canino et al. in Materials Science and Engineering B 178 (2013) 623-629 (Year: 2013).*

Avila "Behavior of oxygen doped SiC thin films: An x-ray photo-electron spectroscopy study" by A. Avila; I. Montero; L. Galán; J. M. Ripalda; R. Levy in J. Appl. Phys. 89, 212-216, (Year: 2001).*

"Chloride-Based SiC Epitaxial Growth toward Low Temperature Bulk Growth" by Stefano Leone et al. in Crystal Growth & Design, vol. 10, No. 8, 2010 (Year: 2010).*

"Low-temperature homoepitaxial growth of 4H—SiC with CH3Cl and SiCl4 precursors" by Siva Kotamraju et al. in Journal of Crystal Growth 312 (2010) 645-650 (Year: 2010).*

"Effect of C/Si ratio on growth of 4H—SiC epitaxial layers on on-axis and 4° off-axis substrates" by G.G. Yan et al. in Journal of Crystal Growth 531 (2020) 125362 (Year: 2020).*

Japanese Office Action issued on Apr. 11, 2023 for Japanese Patent Application No. 2020-037757.

Extended European Search Report dated Aug. 24, 2021 for European Patent Application No. 21159499.9.

Japanese Office Action issued on Sep. 19, 2023 for Japanese Patent Application No. 2020-037757.

Chinese Office Action issued on Dec. 20, 2023 for Chinese Patent Application No. 202110239887.X.

Japanese Office Action issued on Jun. 4, 2024 for Japanese Patent Application No. JP2023-093212.

Japanese Office Action issued on Jun. 4, 2024 for Japanese Patent Application No. JP2023-209109.

Chinese Office Action issued on Jun. 29, 2024 for Chinese Patent Application No. 202110239887.X.

Japanese Office Action issued on Oct. 15, 2024 for Japanese Patent Application No. 2023-093212.

Japanese Office Action issued on Oct. 15, 2024 for Japanese Patent Application No. 2023-209109.

Senzaki, J., et al., "Challenges of High-Performance and High-Reliability in SiC MOS Structures," Materials Science Forum, vol. 717, Trans Tech Publications, 2012, 7 pgs.

* cited by examiner

| | BEFORE TREATMENT | | |
|---|---|---|---|
| angle | 81.125 | 51.125 | 24.875 |
| C-Si | 92.29 | 96.43 | 96.68 |
| C-C | 1.81 | 2.22 | 2.23 |
| C-O | 2.61 | 0.89 | 0.62 |
| C=O | 2.31 | 0.31 | 0 |
| O-C-O | 0.98 | 0.14 | 0 |

| | AFTER TREATMENT | | |
|---|---|---|---|
| angle | 81.125 | 51.125 | 24.875 |
| C-Si | 42.77 | 76 | 83.1 |
| C-C | 36.01 | 15.39 | 8.79 |
| C-O | 10.55 | 4.58 | 3.6 |
| C=O | 4.94 | 1.83 | 2.57 |
| O-C-O | 5.73 | 2.2 | 1.94 |

$$F(t) = 1 - exp\left[-\left(\frac{t}{\eta_t}\right)^{m_t}\right] \quad \cdots (1)$$

SiC WAFER AND MANUFACTURING METHOD THEREOF

CROSS-REFERENCE TO RELATED APPLICATION

The present application claims priority from Japanese Patent Application No. 2020-037757 filed on Mar. 5, 2020, the contents of which are hereby incorporated by reference into this application.

TECHNICAL FIELD OF THE INVENTION

The present invention relates to a SiC wafer and can be particularly utilized for a SiC wafer having an epitaxial layer formed thereon and a manufacturing method thereof.

BACKGROUND OF THE INVENTION

A semiconductor power element is required to have a low on-resistance and a low switching loss in addition to a high withstand voltage, but a silicon (Si) power element, which is the mainstream at present, has been approaching its logical limit of performance. Since silicon carbide (SiC) has a dielectric breakdown field strength larger by about one order of magnitude as compared with Si, the element resistance can be reduced by three or more orders of magnitude in theory by reducing the thickness of the drift layer for holding a withstand voltage to about one-tenth and increasing the impurity concentration to about 100 times. Also, since the bandgap is about three times larger than Si, the high temperature operation is possible and the SiC semiconductor element is expected to have a performance higher than the Si semiconductor element, and the development of the SiC power device has now been in progress.

Patent Document 1 (Japanese Unexamined Patent Application Publication No. 2012-142597) describes the prevention of the occurrence of the step bunching on a surface of a substrate.

Patent Document 2 (Japanese Unexamined Patent Application Publication No. 2010-258294) describes that silicon atoms are evaporated from a surface of a silicon carbide epitaxial layer, whereby a silicon carbide surface is made to be carbon atoms with 95 at % or more.

Patent Documents 3 to 7 (Japanese Unexamined Patent Application Publication No. 2003-282451, Japanese Unexamined Patent Application Publication No. 2015-143168, Japanese Unexamined Patent Application Publication No. 2009-239103, Japanese Unexamined Patent Application Publication No. 2007-137689, and International Publication No. 2015/159949) describe that a flow ratio (material supply ratio) or a composition ratio of an epitaxial growth layer is controlled by adjusting conditions in an epitaxial growth. However, in the techniques described in Patent Documents 3 to 7, the surface of the epitaxial growth layer is not made to be a carbon-rich state, and the flow ratio has no correlation with a composition ratio of a surface of a SiC wafer.

SUMMARY OF THE INVENTION

In the mass production process of the SiC device, a plurality of chip forming regions are simultaneously formed on a wafer, and the wafer is divided into a plurality of chips in the dicing step. There is no problem if all of these chips have the same characteristics, but there are a certain number of defective chips and the device characteristics vary widely among the chips. In the power device that requires a large area, in particular, it is important to reduce the variations in device characteristics in order to improve the yield. For example, Non-Patent Document 1 (Senzaki Junji, et al. "Challenges of High-Performance and High-Reliability in SiC MOS Structures" Materials Science Forum. Vol. 717. Trans Tech Publications, 2012) describes that the reliability of a gate insulating film is improved by preventing the occurrence of step bunching on the substrate surface.

An object of the invention of this application is to provide a SiC wafer having an epitaxial growth layer capable of reducing the variations in the lifetime of the gate insulating film by controlling the composition of the wafer surface.

Other objects and novel features will be apparent from the description of this specification and the accompanying drawings.

An outline of a typical embodiment disclosed in this application will be briefly described as follows.

A SiC wafer according to an embodiment includes a SiC substrate and an epitaxial layer formed on the SiC substrate and containing SiC, and a composition ratio of C—Si of an upper surface of the epitaxial layer is 50 atm % or less.

According to the typical embodiment, it is possible to improve the reliability of the SiC wafer.

BRIEF DESCRIPTIONS OF THE DRAWINGS

Figure 28:
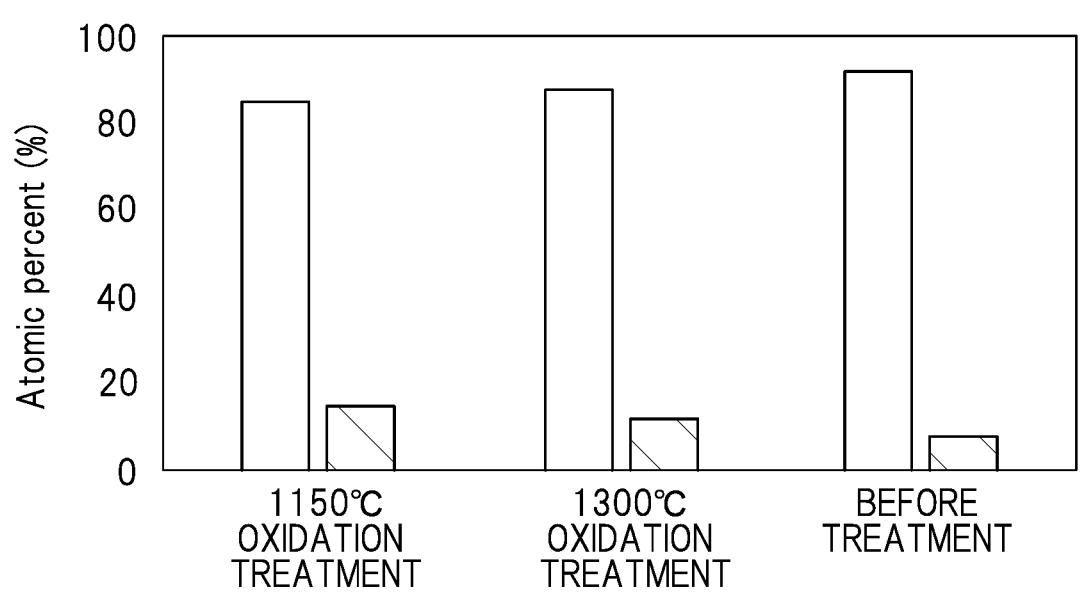
Figure 29:
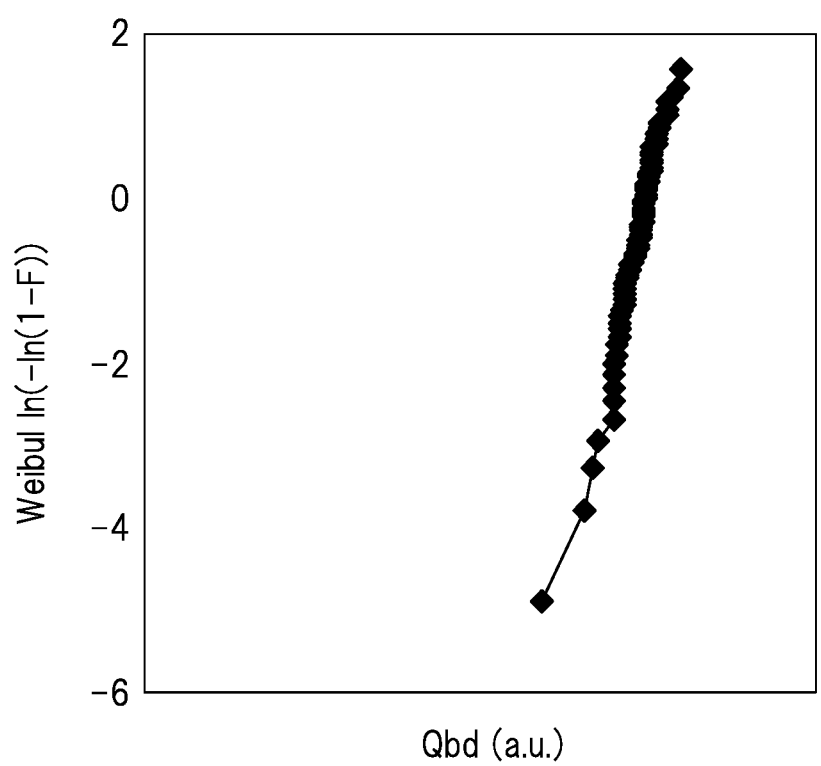

FIG. 28 is a graph showing respective composition ratios of the C—Si bond and the bonds containing carbon other than the C—Si bond in the upper surface of the SiC wafer to which the oxidation process has been performed; and FIG. 29 is a graph showing the relationship between the dielectric breakdown injection charge amount and the cumulative failure rate in the SiC device of the comparative example.

DESCRIPTIONS OF THE PREFERRED EMBODIMENTS

Hereinafter, embodiments of the present invention will be described in detail with reference to drawings. Note that the members having the same function are denoted by the same reference characters throughout the drawings for describing the embodiments, and the repetitive description thereof will be omitted. Also, in the embodiments, the description of the same or similar portion will not be repeated in principle except for the case where it is particularly necessary.

In this application, each of a wafer made of a SiC substrate only and a wafer including a SiC substrate and an epitaxial layer on the SiC substrate is referred to as a SiC wafer. The SiC substrate mentioned here is a bulk substrate including no epitaxial layer.

First Embodiment (Details of Room for Improvement)

SiC (silicon carbide) has a bandgap wider than that of Si (silicon) and an insulating film formed on a SiC substrate has high dielectric breakdown strength. It is conceivable to apply a high voltage to an element formed on the SiC substrate by making use of such characteristics. In this case, however, the electric field applied to the insulating film becomes a problem. Therefore, in the design of the device using the SiC substrate, it is necessary to sufficiently take into account the electric field applied to the insulating film. In particular, in the device structure having a gate insulating film such as a MOSFET (Metal Oxide Semiconductor Field Effect Transistor) or an IGBT (Insulated Gate Bipolar Transistor), when the intensity of the electric field applied to the gate insulating film increases, the leakage current is generated in the gate insulating film. The generation of the leakage current like this causes the reduction in the lifetime of the gate insulating film and the device operation failure such as the dielectric breakdown of the gate insulating film.

The failure described above does not occur similarly in each of the chips divided from one wafer, and the lifetime of the gate insulating film varies for each of the chips (devices). Namely, in the device mass production, a plurality of chip forming regions are simultaneously formed on a wafer, and a plurality of chips are divided from the wafer in the dicing step. There is no problem if all of these chips have the same characteristics, but there are a certain number of defective chips. Examples of the reasons for the occurrence of the defective chips include the defects present on the surface of the SiC substrate in addition to the presence of foreign matters in the manufacturing process.

One example of the defects is the step bunching caused by the step flow growth method. The step bunching is locally formed in a wafer plane in many cases, and the unevenness thereof has various shapes. If the devices are fabricated on the wafer having the step bunching, the characteristic variation of the devices becomes large. Therefore, it is important to reduce the defect such as the unevenness in order to reduce the variation. In the power device that requires a large area, in particular, it is important to reduce the variation in device characteristics in order to improve the yield.

FIG. 29 shows a Weibull plot of the evaluation result of the CCS-TDDB (Constant Current Stress Time Dependent Dielectric Breakdown) characteristics of a plurality of MOSFETs fabricated on a wafer mainly made of silicon carbide (SiC devices) and present on the same wafer plane as a comparative example. The horizontal axis (semi-logarithm) of the graph shown in FIG. 29 represents the charge amount injected into an insulating film formed on the SiC substrate until the dielectric breakdown occurs in the insulating film, that is, the dielectric breakdown injection charge amount Qbd. Also, the vertical axis of the graph represents the cumulative failure rate. Namely, FIG. 29 is a graph showing the relationship between the dielectric breakdown injection charge amount and the cumulative failure rate in the SiC device in the comparative example.

The Weibull plot is the graph obtained by plotting, with the Weibull distribution, the dielectric breakdown injection charge amount Qbd of a plurality of devices at the time when a constant current stress (CCS) is applied to the gate in a MOS structure such as the MOS capacitor or the MOSFET. By measuring the stress time that elapses before the gate insulating film is broken down when the constant current stress (CCS) is applied to the gate, the dielectric breakdown injection charge amount Qbd can be calculated from the stress time and the stress current.

In the Weibull plot, the distribution of the plot has the linear shape parallel to the vertical axis when the variation in the time (lifetime) that elapses before the dielectric breakdown occurs is zero. However, in the comparative example shown in FIG. 29, the Weibull plot has the slope. This slope in the Weibull plot indicates the presence of the variation, and it means that there is the defect that causes the reduction in the dielectric breakdown injection charge amount Qbd.

As described above, in the SiC wafer, there is a room for improvement such as the reduction in the characteristic variation including the lifetime of the insulating film among the devices formed on the SiC wafer.

<Configuration of SiC Wafer>

In the first embodiment, the technique for achieving the above-mentioned improvement is adopted. Hereinafter, the technical idea of the present embodiment in which such a technique is adopted will be described.

The studies by the inventors have revealed that the composition of the wafer surface affects the reliability of the gate insulating film and the variation in the lifetime of the gate insulating film can be reduced by controlling the composition of the surface of the SiC wafer. The SiC wafer having an epitaxial layer with which the variation in the lifetime of the gate insulating film can be reduced by controlling the composition of the surface of the SiC wafer will be described below.

Figure 1:
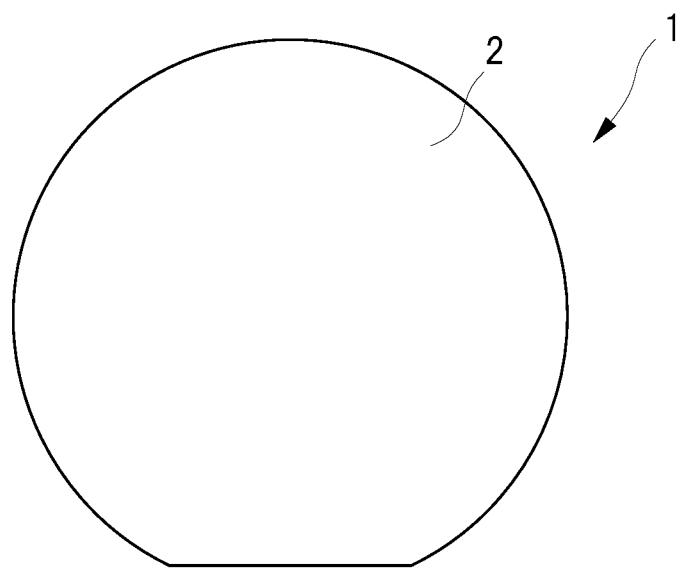
FIG. 1 is a plan view showing a manufacturing process of a SiC wafer according to the first embodiment.

Here, the manufacturing process of the SiC wafer according to the present embodiment will be described with reference to FIG. 1 to FIG. 4. FIG. 1 is a plan view showing the manufacturing process of the SiC wafer according to the present embodiment, and FIG. 2 to FIG. 4 are cross-sectional views showing the manufacturing process of the SiC wafer according to the present embodiment.

Figure 2:
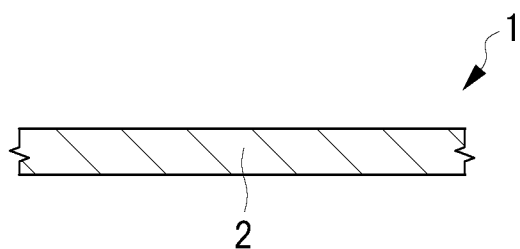
FIG. 2 is a cross-sectional view showing the manufacturing process of the SiC wafer according to the first embodiment.

When manufacturing the SiC wafer according to the present embodiment, first, as shown in FIG. 1 and FIG. 2, a SiC wafer 1 made of a SiC substrate (SiC bulk substrate) 2 only is prepared. The crystal form of the SiC substrate 2 is, for example, 4H-SiC, but it may be 6H-SiC or 3H-SiC. It is preferable that the off angle of the main surface of the SiC substrate 2 is, for example, larger than 0.5 degree and smaller than 8 degrees. In this case, the off angle of the main surface of the SiC substrate 2 is, for example, 4 degrees. The plane orientation of the main surface of the SiC substrate 2 may be any of the Si plane, the C plane, and others, and the plane orientation of the main surface of the SiC substrate 2 is the Si plane in this case.

The SiC substrate 2 may be any of the substrate fabricated by the sublimation method, the substrate fabricated by the solution method, and the substrate fabricated by the gas growth method. The n type impurity concentration of the SiC substrate 2 is, for example, $1 \times 10^{18}/\text{cm}^{-3}$ to $1 \times 10^{21}/\text{cm}^{-3}$, and is $1 \times 10^{18}/\text{cm}^{-3}$ in this case.

Figure 3:
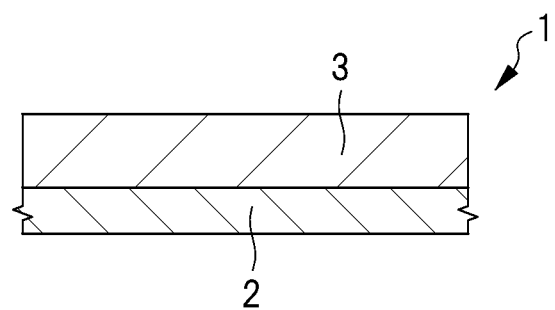
FIG. 3 is a cross-sectional view showing the manufacturing process subsequent to FIG. 2.
Figure 4:
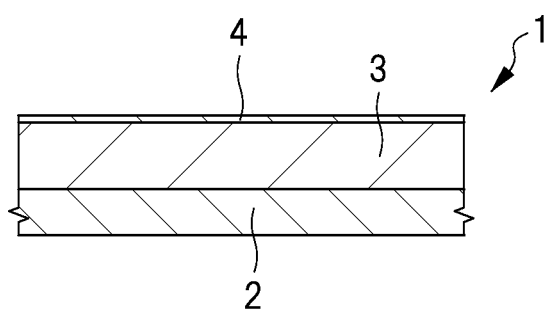
FIG. 4 is a cross-sectional view showing the manufacturing process subsequent to FIG. 3.

Next, as shown in FIG. 3, an epitaxial layer (epitaxial growth layer, semiconductor layer) 3 is formed on the main surface of the SiC substrate 2 by using the epitaxial growth method. Specifically, SiH$_4$ (monosilane) and C$_3$H$_8$ (propane) are supplied to the SiC substrate 2 with using H$_2$ (hydrogen) as a carrier gas under the temperature of 1500° C. or higher. Note that trichlorosilane and methane may be used as the gas for the epitaxial growth. In addition, hydrogen chloride may be introduced for the purpose of improving the growth rate. In this manner, the epitaxial growth occurs and the epitaxial layer 3 is formed. At this time, the epitaxial layer 3 is mainly made of SiC.

The n type impurity concentration of the epitaxial layer 3 differs depending on the device to be fabricated, and it is, for example, about $1 \times 10^{14}/\text{cm}^{-3}$ to $1 \times 10^{18}/\text{cm}^{-3}$. Also, the film thickness of the epitaxial layer 3 differs depending on the device to be fabricated, and it is, for example, several μm to several tens μm.

Also, it is conceivable that the basal plane dislocation (BPD) which is the defect to be the cause of the electrical conduction degradation is present in the SiC substrate 2. The BPD extended from the SiC substrate 2 into the epitaxial layer 3 at the time of the epitaxial growth has the characteristics of blocking the electrical conduction and being expanded during the electrical conduction. On the other hand, it is conceivable that a part of the BPD in the SiC substrate 2 is transformed into threading edge dislocation (TED) at the interface between the SiC substrate 2 and the epitaxial layer 3 and extends into the epitaxial layer 3. The TED does not block the electrical conduction in the substrate and is not expanded during the electrical conduction.

Thus, a buffer layer (semiconductor layer) having a high concentration made of SiC may be formed on the SiC substrate 2 before forming the epitaxial layer 3. The n type impurity concentration of the buffer layer is, for example, about $1 \times 10^{18}/\text{cm}^{-3}$. By providing the buffer layer between the SiC substrate 2 and the epitaxial layer 3, it is possible to reduce the probability that the BPD is expanded into the epitaxial layer 3. Namely, during the epitaxial growth, the BPD in the SiC substrate 2 is likely to be transformed into the TED at the interface between the SiC substrate 2 and the buffer layer. Furthermore, the presence of the buffer layer makes it possible to reduce the probability that holes reach the BPD of the SiC substrate 2. Consequently, it is possible to reduce the probability that the electrical conduction degradation occurs in the device formed on the stacked substrate including the SiC substrate 2 and the epitaxial layer 3.

In addition, the CMP (Chemical Mechanical Polishing) may be performed to the upper surface of the SiC substrate 2 or the upper surface of the buffer layer before forming the epitaxial layer 3.

Further, although the case where the epitaxial layer 3 is formed on the SiC substrate 2 has been described here, a stacked substrate (SiC wafer 1) in which the epitaxial layer 3 has already been stacked on the SiC substrate 2 may be prepared instead of the steps described with reference to FIG. 1 to FIG. 3.

Next, as shown in FIG. 4, the carbon-rich treatment is performed. Namely, the treatment to make the surface composition of the epitaxial layer 3 rich in carbon is performed. Specifically, the surface composition of the upper surface of the epitaxial layer 3 is modified so as to achieve the state where the ratio (atomic percent:atm %) of the bonds other than the C—Si bond such as the C—C bond and the C—O bond is larger than the ratio of the C—Si bond. Namely, the carbon-rich mentioned in this application indicates the state where the ratio of the bonds containing C other than the C—Si bond is larger than the ratio of the C—Si bond. In other words, the carbon-rich mentioned in this application indicates that the composition ratio of C—Si of the upper surface of the epitaxial layer is 50 atm % or less.

Some methods are applicable to the carbon-rich treatment, and the surface composition is modified by, for example, the CMP in this case. In this manner, a carbon-rich layer 4 is formed on the upper surface of the epitaxial layer 3. The composition of the surface of the SiC wafer can be modified by, for example, the CMP method.

The ratio of the surface composition of the epitaxial layer 3 (composition of the carbon-rich layer 4) can be examined by, for example, the surface composition analysis using the XPS (X-ray Photoelectron Spectroscopy). In the surface composition analysis using the XPS in this case, the condition of the carbon-rich treatment is adjusted so as to achieve the state where the ratio of the bonds other than the C—Si bond such as the C—C bond and the C—O bond is larger than the ratio of the C—Si bond when the peak separation of C1s spectrum is performed.

Figure 5:
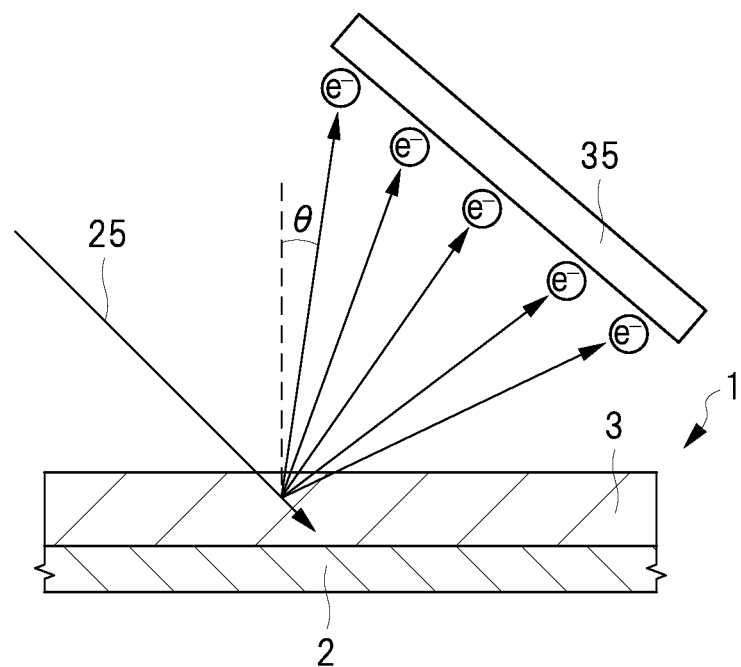
FIG. 5 is a schematic diagram for describing the surface composition analysis method using the XPS.
Figure 6:
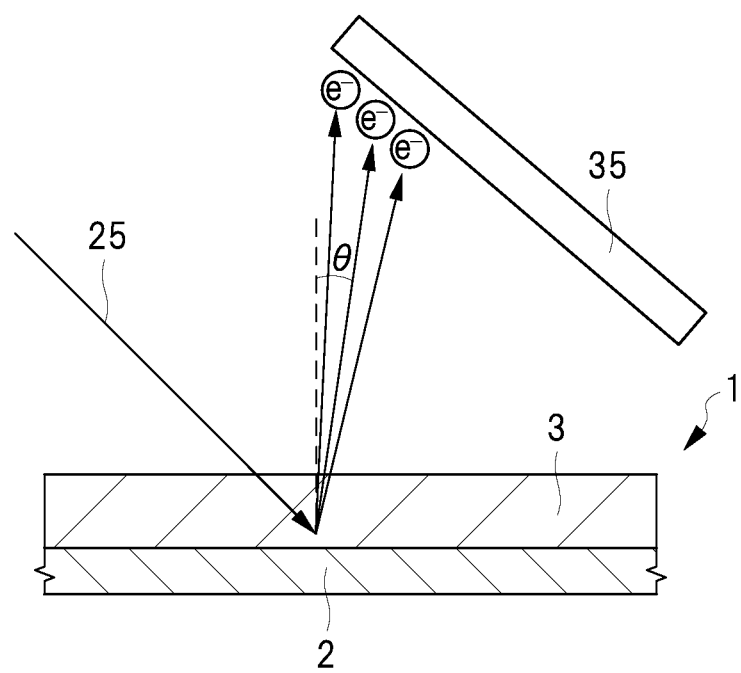
FIG. 6 is a schematic diagram for describing the surface composition analysis method using the XPS.

FIG. 5 and FIG. 6 show the schematic diagrams for describing the surface composition analysis method using the XPS. In FIG. 5 and FIG. 6, the illustration of the carbon-rich layer formed on the upper surface of the epitaxial layer is omitted. Here, the XPS provided with a detector (detection unit) 35 having an angle-resolution function is used. When the surface composition analysis is performed using the XPS, since the detector 35 has the angle-resolution function, the information at a depth of several nm (for example, 1 to 3 nm) from the wafer surface can be obtained by resolution from the information at a deeper position (for example, 7 nm) from the wafer surface. In other words, when the detector 35 does not have the angle-resolution function, it is not possible to separately detect the surface composition of a relatively shallow region of the wafer surface and the surface composition of a relatively deep region of the wafer surface.

In the XPS measurement, the SiC wafer 1 is irradiated with X-ray 25 having a strong penetration power, and photoelectrons (secondary electrons) generated by the irradiation are detected. Therefore, the detection depth is determined by the mean free path of photoelectrons. In the XPS having the angle-resolution function in the detector, the depth information can be acquired from the position in the detector plane where photoelectrons are detected. Namely, the photoelectrons generated in the shallow region of the wafer surface can be detected on the entire surface of the detector 35 as shown in FIG. 5. On the other hand, since the mean free path in the SiC wafer 1 of the photoelectrons generated in the deep region of the wafer surface is short, the photoelectrons can escape only at a low angle and cannot escape from the SiC wafer 1 at a high angle as shown in FIG. 6. Therefore, the composition analysis in a relatively shallow region of the wafer surface (for example, a region of 1 to 3 nm from the wafer surface) can be performed from the photoelectrons released from the wafer at a low angle toward the detector 35. As described above, by using the XPS having an angle-resolution function, the composition at a depth of several nm from the wafer surface can be acquired by resolution.

The angles mentioned here such as a high angle and a low angle (takeoff angle, release angle of secondary electrons) correspond to the angle θ between the line perpendicular to the surface (main surface) of the SiC wafer 1 and the traveling direction of the photoelectrons released from the surface of the SiC wafer 1 by the irradiation of the X-ray 25.

In the present embodiment, the surface composition of the SiC wafer is adjusted by the carbon-rich treatment such that the surface composition ratio of C—Si becomes 43 atm % when the composition analysis of the region extremely close to the surface of the SiC wafer (for example, the region of 1 to 3 nm from the wafer surface) is performed by the XPS. However, if the composition of the region extremely close to the surface of the SiC wafer (for example, the region of 1 to 3 nm from the wafer surface) is not detected by resolution, the result of the XPS analysis includes the information of the state of the bonds in the deep region of about several nm (for example, 7 nm) from the wafer surface. In this case, the surface composition ratio of C—Si, which is the result of the XPS analysis, is 83 atm %. This will be described below with reference to FIG. 7 to FIG. 13.

Figure 7:
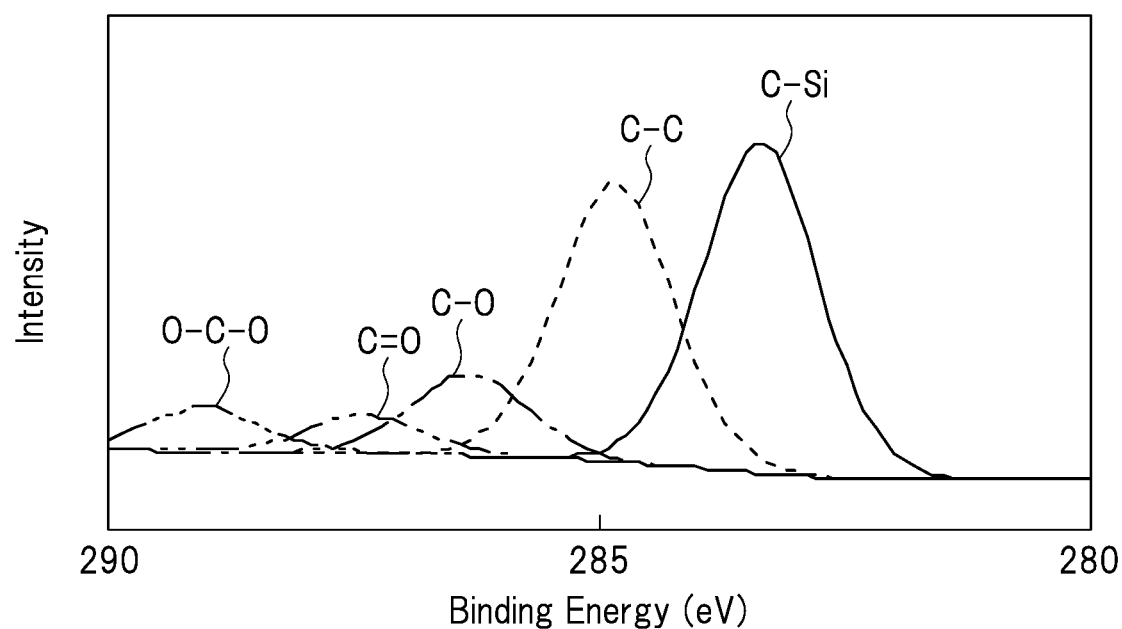
FIG. 7 is a graph showing details of peak separation of the C1s spectrum obtained by the surface composition analysis using the XPS.
Figure 8:
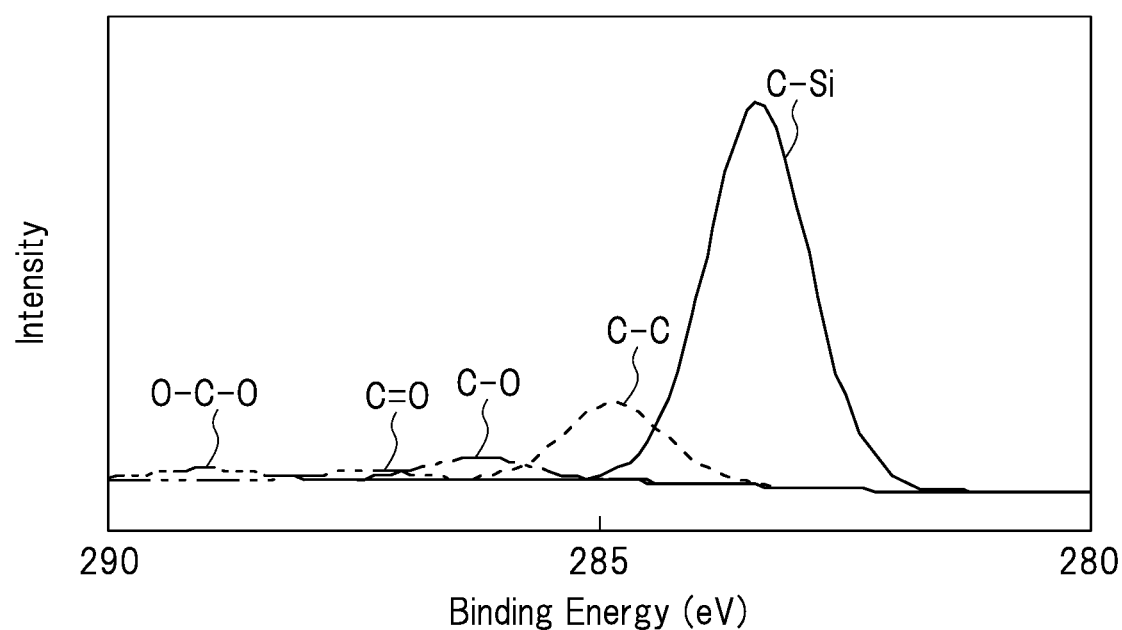
FIG. 8 is a graph showing details of peak separation of the C1s spectrum obtained by the surface composition analysis using the XPS.
Figure 9:
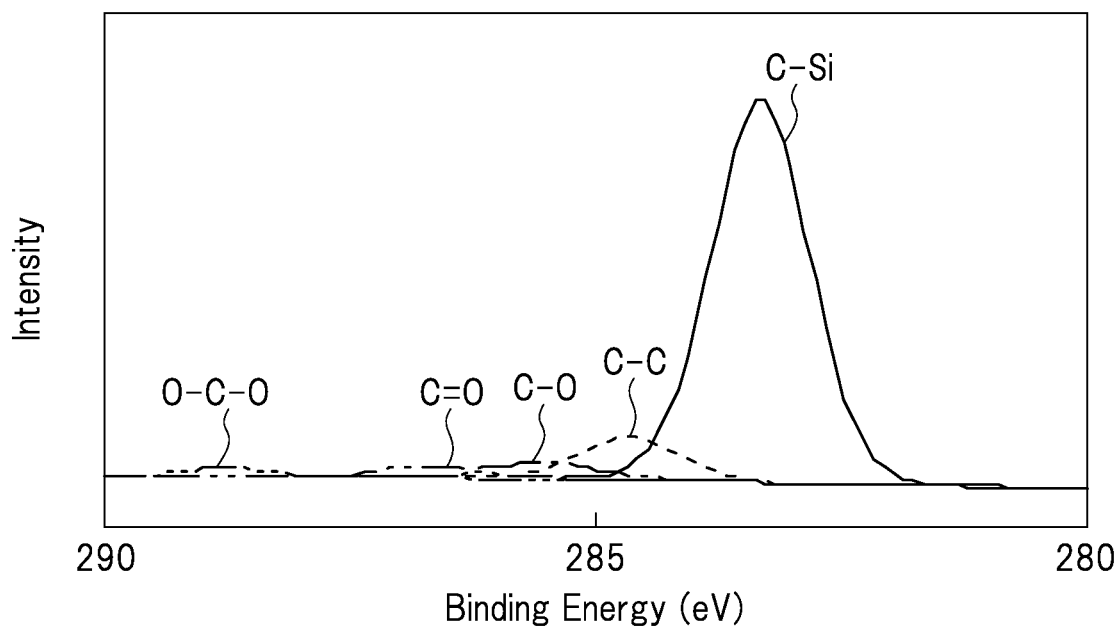
FIG. 9 is a graph showing details of peak separation of the C1s spectrum obtained by the surface composition analysis using the XPS.
Figure 10:
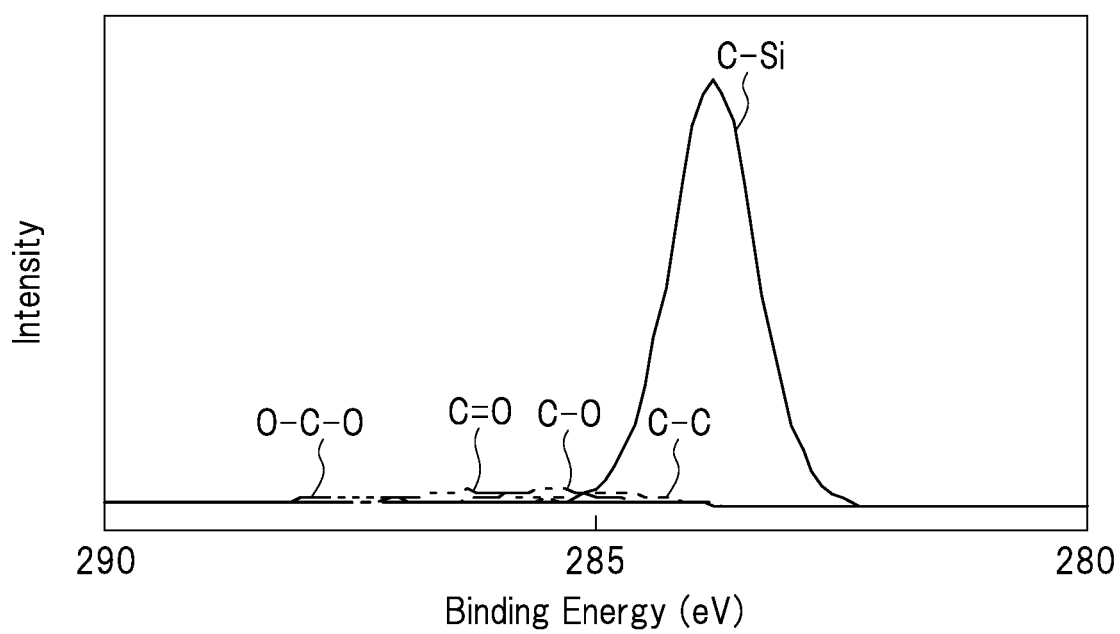
FIG. 10 is a graph showing details of peak separation of the C1s spectrum obtained by the surface composition analysis using the XPS.

FIG. 7 to FIG. 10 are graphs showing details of peak separation of the C1s spectrum obtained by the surface composition analysis using the XPS. In these graphs, the horizontal axis represents the binding energy of the composition of the wafer surface and the vertical axis represents the energy of the photoelectrons (released photoelectron intensity). FIG. 7 to FIG. 9 show the result of the XPS analysis in the SiC wafer to which the carbon-rich treatment of the present embodiment is applied, and FIG. 10 shows the result of the XPS analysis in the SiC wafer of a comparative example to which the carbon-rich treatment of the present embodiment is not applied.

FIG. 7 and FIG. 10 are the graphs showing the analysis result in the case where the detection angle of the detector 35 is 81.125 degrees, that is, the high angle. Namely, FIG. 7 and FIG. 10 show the composition in the relatively shallow region of the wafer surface. FIG. 9 is a graph showing the analysis result in the case where the detection angle of the detector 35 is 24.875 degrees, that is, the low angle. Namely, FIG. 9 shows the composition in the relatively deep region of the wafer surface. FIG. 8 is a graph showing the analysis result in the case where the detection angle of the detector 35 is 51.125 degrees. Namely, FIG. 8 shows the composition in the region having an intermediate depth between FIG. 7 showing the composition in the shallow region and FIG. 9 showing the composition in the deep region. Since the composition of the relatively deep region of the wafer surface of the comparative example is almost the same as the composition of the relatively shallow region of the wafer surface of the comparative example shown in FIG. 10, the illustration thereof is omitted here.

FIG. 7 to FIG. 10 show the graphs of the analysis result of each of C—Si which is the bond of carbon and silicon, C—C which is the bond of carbon and carbon, C—O which is the bond of carbon and oxygen, C=O which is the double bond of carbon and oxygen, and O—C—O which is the ether bond of oxygen and carbon. In FIG. 7 to FIG. 10, the graph of C—Si is shown by a solid line, the graph of C—C is shown by a broken line, the graph of C—O is shown by a one-dot chain line, the graph of C=O is shown by a two-dot chain line, and the graph of O—C—O is shown by a three-dot chain line.

Figures 11, 12:
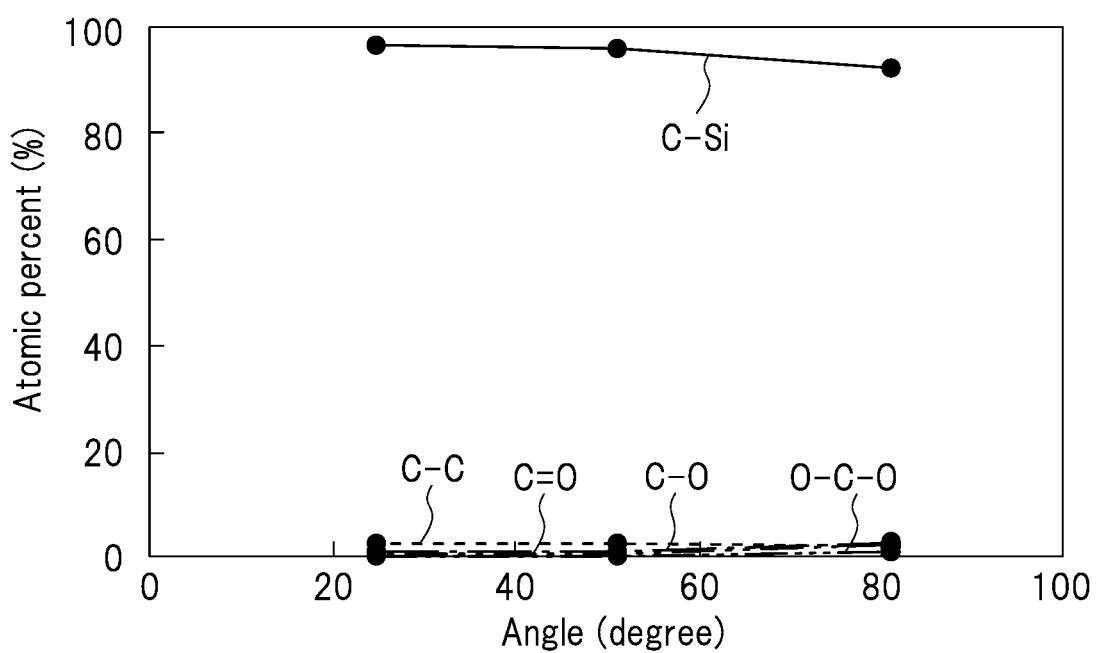
FIG. 11 is a table showing the relationship between the composition ratios of various bonds containing carbon in the surface of the SiC wafer before the carbon-rich treatment and the takeoff angles in the XPS analysis.
FIG. 12 is a graph showing the relationship between the composition ratios of various bonds containing carbon in the surface of the SiC wafer before the carbon-rich treatment and the takeoff angles in the XPS analysis.
Figures 13, 14:
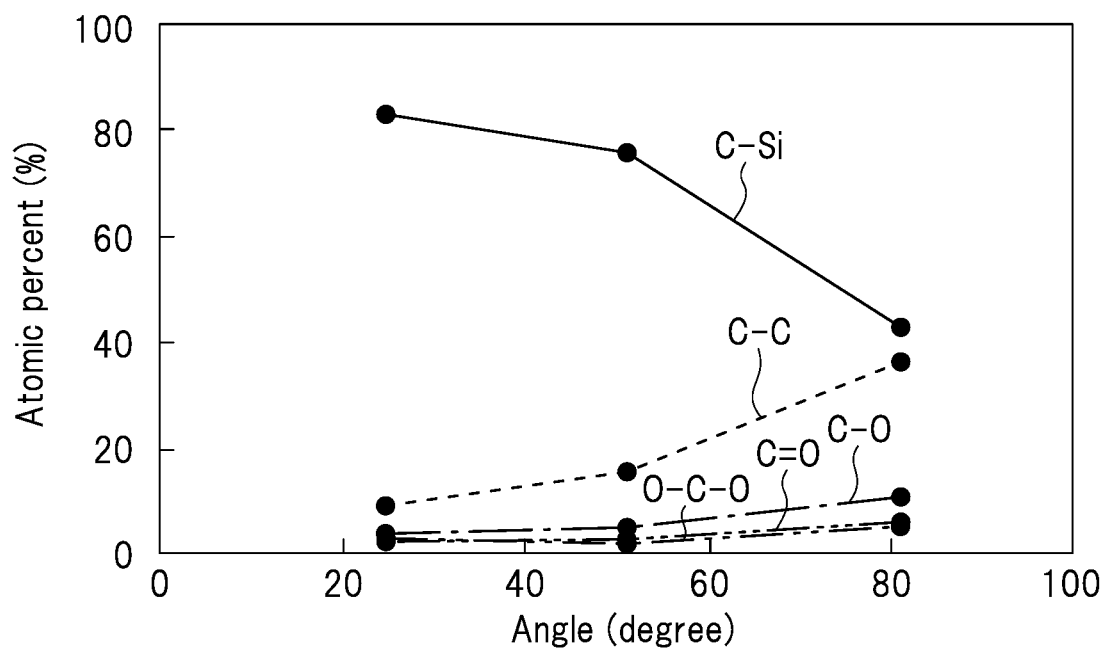
FIG. 13 is a table showing the relationship between the composition ratios of various bonds containing carbon in the surface of the SiC wafer after the carbon-rich treatment and the takeoff angles in the XPS analysis.
FIG. 14 is a graph showing the relationship between the composition ratios of various bonds containing carbon in the surface of the SiC wafer after the carbon-rich treatment and the takeoff angles in the XPS analysis.

As shown in FIG. 7 to FIG. 9, the composition ratio of each of the various bonds containing carbon has the depth dependence. This will be described below with reference to FIG. 11 to FIG. 15. FIG. 11 and FIG. 12 are a table and a graph showing the relationship between the composition ratios of various bonds containing carbon in the surface of the SiC wafer before the carbon-rich treatment and the takeoff angles of the XPS analysis. FIG. 13 and FIG. 14 are a table and a graph showing the relationship between the composition ratios of various bonds containing carbon in the surface of the SiC wafer after the carbon-rich treatment and the takeoff angles of the XPS analysis. In FIG. 12 and FIG. 14, the horizontal axis of the graph shows the takeoff angle of the XPS analysis, and the vertical axis of the graph represents the composition ratio. The larger the takeoff angle of the XPS analysis represented on the horizontal axis of these graphs, the closer the location of the XPS analysis is to the wafer surface.

Figures 15, 16:
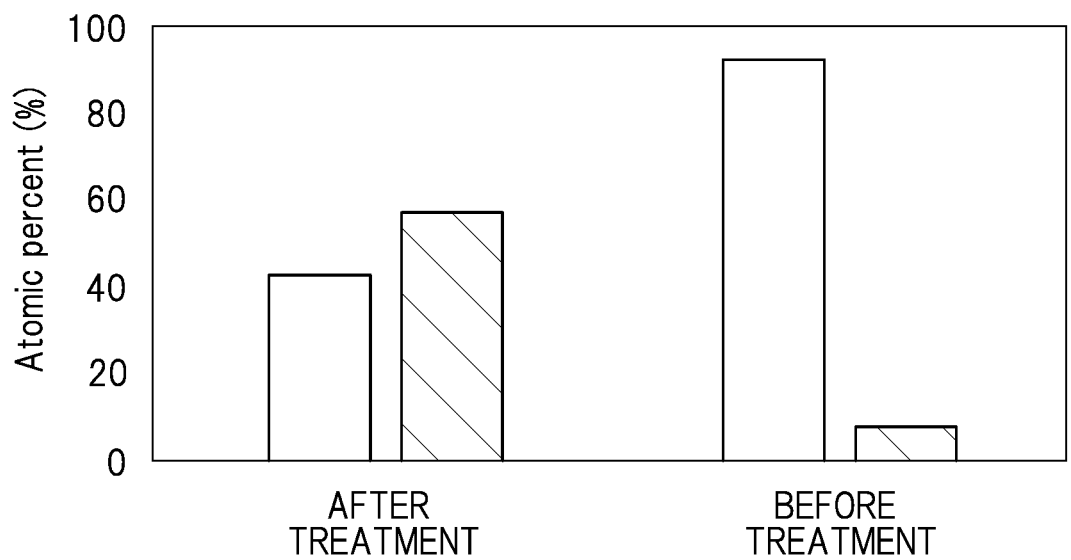
FIG. 15 is a graph showing the composition ratio of the C—Si bond and the sum of the composition ratios of the bonds containing carbon other than the C—Si bond each before and after the carbon-rich treatment.
FIG. 16 is an expression showing the cumulative failure rate.

FIG. 15 is a graph showing the composition ratio of the C—Si bond and the sum of the composition ratios of the bonds containing carbon other than the C—Si bond each before and after the carbon-rich treatment. In FIG. 15, the graph before the carbon-rich treatment is shown on the right side and the graph after the carbon-rich treatment is shown on the left side. In FIG. 15, the composition ratio of the C—Si bond is shown by a white bar graph, and the bar graph of the sum of the composition ratios of the bonds containing carbon other than the C—Si bond is hatched.

In FIG. 12 and FIG. 14, the graph of C—Si is shown by a solid line, the graph of C—C is shown by a broken line, the graph of C—O is shown by a one-dot chain line, the graph of C=O is shown by a two-dot chain line, and the graph of O—C—O is shown by a three-dot chain line.

As shown in FIG. 11, FIG. 12, and FIG. 15, before the carbon-rich treatment, most of the composition ratio of the region near the wafer surface is occupied by the C—Si bond, and the ratio of sum of the composition ratios of the bonds containing carbon other than the C—Si bond is equal to or less than the composition ratio of the C—Si bond. On the other hand, as shown in FIG. 13 to FIG. 15, after the carbon-rich treatment, in the composition ratio of the region near the wafer surface, in particular, in the shallow region, the ratio of the C—Si bond is about 43% and is the largest. However, as shown in FIG. 13 to FIG. 15, the ratio of the sum of the composition ratios of the bonds containing carbon other than the C—Si bond is about 57% and is larger than the composition ratio of the C—Si bond. In particular, the composition ratio of the C—C bond in the relatively shallow region of the wafer surface is close to the composition ratio of the C—Si bond.

As described above, in the wafer surface, the ratio of the sum of the composition ratios of the bonds containing carbon other than the C—Si bond is larger than the composition ratio of the C—Si bond. Namely, it is in the carbon-rich state. Further, when the surface composition of the SiC wafer is adjusted by the carbon rich treatment, the surface composition ratio of the C—Si in the region extremely close to the surface of the SiC wafer (for example, in the region of 1 to 3 nm from the wafer surface) is 43 atm % by the XPS. Accordingly, it can be said that it is in the carbon-rich state if the composition ratio of C—Si in the region extremely close to the surface of the epitaxial layer is 50 atm % or less, when the measurement is performed using the XPS having the angle-resolution function. On the other hand, the surface composition ratio of C—Si in the deep region of about several nm (for example, 7 nm) from the wafer surface becomes 83 atm % by the carbon-rich treatment. Therefore, it can be said that it is in the carbon-rich state if the surface composition ratio of C—Si in the deep region of about several nm (for example, 7 nm) from the wafer surface is 83 atm % or less. Namely, even when the composition ratio of the wafer surface is measured using the XPS having no angle-resolution function, it is not possible to separately measure the shallow region and the deep region of the wafer surface. Therefore, it can be said that it is in the carbon-rich state if the composition ratio of C—Si of the upper surface of the epitaxial layer corresponding to the wafer surface is 83 atm % or less, when the measurement is performed using such an XPS.

In this case, the inventors found that the composition ratio of C—C was 8.79 atm % and the composition ratio of C—O was 3.6 atm % in the upper surface of the epitaxial layer when the takeoff angle of the XPS was 24.875 degrees. Namely, it is conceivable that it is in the carbon-rich state if the composition ratio of C—C is 8.7 atm % or more and the composition ratio of C—O is 3.6 atm % or more, when the takeoff angle of the XPS is small and the relatively deep region of the epitaxial layer is analyzed.

In addition, the inventors found that the composition ratio of C—C was 36.01 atm % and the composition ratio of C—O was 10.55 atm % in the upper surface of the epitaxial layer when the takeoff angle of the XPS was 81.125 degrees. Namely, it is conceivable that it is in the carbon-rich state if the composition ratio of C—C is 35 atm % or more and the composition ratio of C—O is 10 atm % or more, when the takeoff angle of the XPS is large and the relatively shallow region of the epitaxial layer is analyzed.

Effect of the Present Embodiment

The inventors performed the TDDB characteristic evaluation for 68 DMOSFETs (Double-Diffused MOSFET) fabricated on each of the SiC wafer according to the present embodiment to which the carbon-rich treatment was performed and the SiC wafer to which the carbon-rich treatment was not performed. In this case, the potential of each of the source and drain was set to 0 V, the controlled voltage was applied to the gate such that a constant current flowed, and the time that elapsed before the gate insulating film was broken down was measured. The temperature at the measurement was set to about 150° C. and the voltage was adjusted such that the current density was constant.

Figure 17:
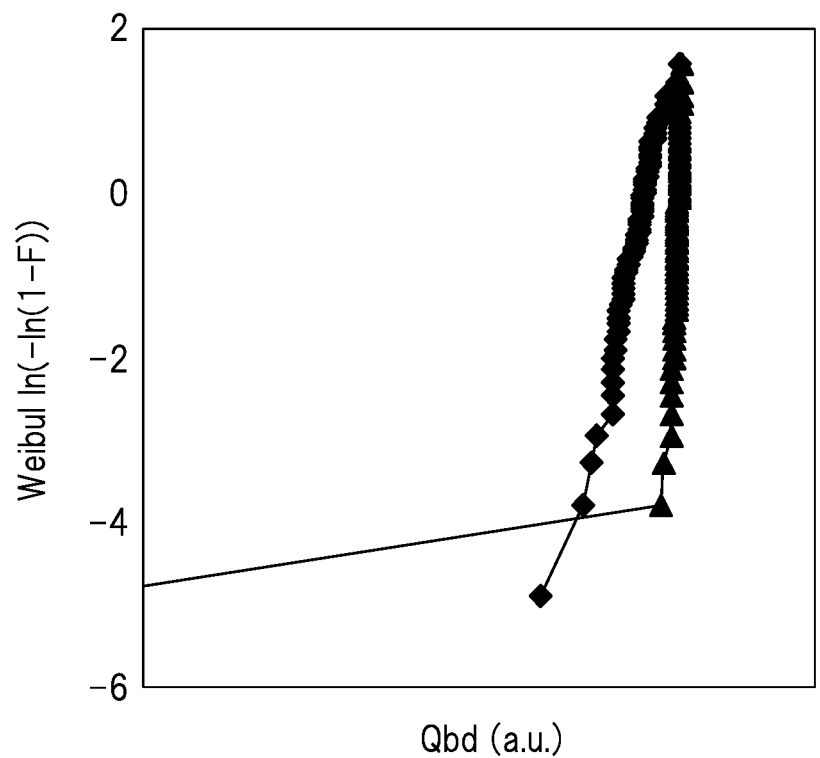
FIG. 17 is a graph showing the relationship between the dielectric breakdown injection charge amount and the cumulative failure rate in each of the SiC devices of a comparative example and the present embodiment.

FIG. 17 shows the Weibull plot of the result of the evaluation of the TDDB characteristics described above. The horizontal axis and the vertical axis of the graph shown in FIG. 17 represent the dielectric breakdown injection charge amount Qbd and the cumulative failure rate, respectively, like the horizontal axis and the vertical axis of FIG. 29. FIG. 17 is a graph showing the relationship between the dielectric breakdown injection charge amount and the cumulative failure rate in each of the SiC devices of the comparative example and the present embodiment. In FIG. 17, the plot of the evaluation result of the device of the comparative example in which the carbon-rich treatment is not performed is shown by rhombus and the plot of the evaluation result of the device using the wafer according to the present embodiment in which the carbon-rich treatment is performed is shown by triangle.

In this evaluation, the shape parameter m was calculated for the analysis. Also, the scale parameter was defined as $\eta$. In general, when the cumulative failure rate F(t) follows the Weibull distribution, the cumulative failure rate F(t) is described by the expression (1) shown in FIG. 16.

Further, the expression (1) is rewritten into the following expression (2).

$$\ln(-\ln(1-F(t)))=m \ln(t)-m \ln\eta \qquad (2)$$

In the Weibull plot, the slope when $y=\ln(-\ln(1-F(t)))$ and $x=\ln(t)$ is m, and the intercept is $-m\ln\eta$. Namely, the distribution becomes uniform and characteristic variation decreases as $\eta$ increases, and the maximum value of the main distribution increases as $\eta$ increases. In other words, as shown in FIG. 17, the graph of the Weibull plot of the comparative example has the slope with respect to the vertical axis, but the graph of the Weibull plot of the present embodiment has the uniform distribution parallel to the vertical axis.

When the shape parameter m was calculated for each of the conditions of the present embodiment in which the carbon-rich treatment was performed and the comparative example in which the carbon-rich treatment was not performed, m was 11.3 (m=11.3) in the condition in which the carbon-rich treatment was performed and m was 2.1 (m=2.1) in the condition in which the carbon-rich treatment was not performed. Namely, the value of m was increased by the carbon-rich treatment. Also, the inventors found that the value of $\eta$ was also increased. This indicates that the slope of the main distribution becomes steep and the maximum value of Qbd becomes high. The increase in m and $\eta$ by the carbon-rich treatment is advantageous from the viewpoint of improving the yield.

As described above, in the present embodiment, the SiC wafer having the epitaxial layer formed on the SiC substrate and having the main surface in the carbon-rich state is provided. Namely, the composition ratio of C—Si of the upper surface of the epitaxial layer is 50 atm % or less. In the elements such as the MOSFET having the gate insulating film formed on the SiC wafer described above, the time (lifetime) that elapses before the dielectric breakdown occurs can be extended because the surface of the SiC wafer is in the carbon-rich state. In addition, the characteristics such as the lifetime of the gate insulating film of the elements formed in each chip region arranged in matrix on the circular SiC wafer can be made uniform, and it is possible to prevent the occurrence of the characteristic variation. Accordingly, it is possible to achieve the above-mentioned improvement. Namely, it is possible to improve the reliability of the SiC wafer. Further, since the occurrence of defective chips can be prevented, it is possible to improve the product yield by using the SiC wafer according to the present embodiment to which the carbon-rich treatment is performed.

However, it is necessary to pay attention to the composition ratio in the wafer plane after the carbon-rich treatment. If the SiC surface is completely carbonized by the carbon-rich treatment, that is, if the composition ratio of the bonds other than the C—Si bond of the wafer surface becomes 90 to 100 atm %, graphene is present at the interface between the layer made of SiC (epitaxial layer) and the gate insulating film when a device such as a MOSFET or an IGBT is fabricated. When graphene is present at the SiC/SiO$_2$ interface, there is the possibility that the source and the drain are electrically conducted regardless of the gate voltage and the element does not operate normally. Therefore, it is desirable that the composition ratio of C—Si of the wafer surface is larger than 10 atm %.

As described above, in order to obtain the effect of the present embodiment, it is necessary to adjust the composition ratio of the C—Si bond to be larger than 10 atm %.

<First Modification>

The above-described carbon-rich treatment may be the short-time heat treatment performed to the SiC wafer at the temperature of about 1300° C. in the inert gas (for example, Ar (argon)) atmosphere. The carbon-rich treatment can be performed by carbonizing the surface of the SiC wafer by such a heat treatment.

Also in this case, however, it is necessary to pay attention to the composition ratio in the wafer plane after the carbon-rich treatment. Namely, if the SiC surface is completely carbonized by the high-temperature annealing in the Ar atmosphere, graphene is formed at the SiC/SiO$_2$ interface, so that there is the possibility that the source and the drain are electrically conducted regardless of the gate voltage and the element does not operate normally. Therefore, it is desirable that the composition ratio of C—Si of the wafer surface is larger than 10 atm %.

<Second Modification>

A process of forming a DMOSFET on a SiC wafer will be described below with reference to FIG. 18 to FIG. 27 as a second modification of the present embodiment. FIG. 18 to FIG. 26 are cross-sectional views showing the manufacturing process of the DMOSFET on the SiC wafer according to this modification. FIG. 27 is a plan view showing the manufacturing process of the DMOSFET on the SiC wafer according to this modification.

First, as described above with reference to FIG. 1 to FIG. 4, the SiC wafer 1 having the epitaxial layer 3 to which the carbon-rich treatment is performed is formed. Note that the illustration of the carbon-rich layer on the upper surface of the epitaxial layer 3 is omitted in FIG. 18 to FIG. 26 used in the following description.

Figure 18:
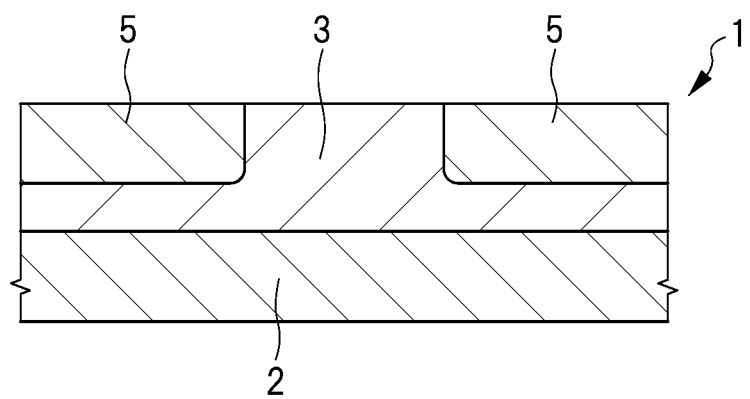
FIG. 18 is a cross-sectional view showing a manufacturing process of a DMOSFET on a SiC wafer according to a modification of the first embodiment.

Next, as shown in FIG. 18, Al (aluminum) ions are implanted into a surficial portion of the epitaxial layer 3 with using a mask (not shown) provided on the epitaxial layer 3. As a result, a p body region 5 which is a p type semiconductor region is formed in the upper surface of the epitaxial layer 3. Note that the impurity implantation depth is, for example, about 1 μm. Also, the p type impurity concentration of the p body region 5 is, for example, in the range of $5\times10^{16}$ cm$^{-3}$ to $1\times10^{19}$ cm$^{-3}$. Further, the ions implanted to form the p body region 5 may be B (boron) ions. In addition, it is also possible to form another p type epitaxial layer made of SiC on the epitaxial layer 3 and use the epitaxial layer as the p body region. In this case, the carbon-rich treatment described with reference to FIG. 4 is not performed before forming the epitaxial layer, but is performed after forming the epitaxial layer and before forming the gate insulating film described below. Thereafter, the above-mentioned mask is removed.

Figure 19:
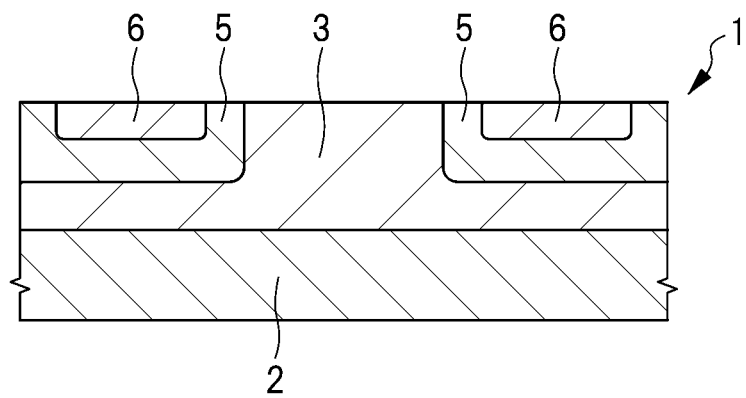
FIG. 19 is a cross-sectional view showing the manufacturing process subsequent to FIG. 18.

Next, as shown in FIG. 19, N (nitrogen) ions are implanted into the upper surface of the epitaxial layer 3 with using a mask (not shown) provided on the epitaxial layer 3. As a result, a source region 6 which is an n type semiconductor region having a depth shallower than that of the p body region 5 is formed in the upper surface of the p body region 5. The impurity implantation depth is, for example, in the range of 0.1 to 0.5 μm. Also, the n type impurity concentration of the source region 6 is, for example, in the range of $1\times10^{18}$ cm$^{-3}$ to $1\times10^{21}$ cm$^{-3}$. Further, the ions implanted to form the source region 6 may be P (phosphorus) ions. Thereafter, the above-mentioned mask is removed.

Figure 20:
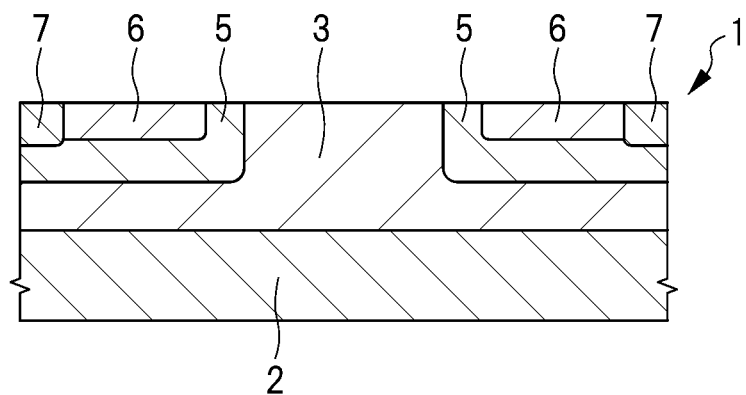
FIG. 20 is a cross-sectional view showing the manufacturing process subsequent to FIG. 19.

Next, as shown in FIG. 20, Al ions are implanted into the upper surface of the epitaxial layer 3 with using a mask (not shown) provided on the epitaxial layer 3. As a result, a potential fixing region 7 which is a p type semiconductor region having a depth shallower than that of the p body region 5 and adjacent to the source region 6 is formed in the upper surface of the p body region 5. The impurity implantation depth is, for example, in the range of 0.1 to 0.5 μm. Also, the p type impurity concentration of the potential fixing region 7 is, for example, in the range of $1\times10^{18}$ cm$^{-3}$ to $1\times10^{21}$ cm$^{-3}$. Further, the ions implanted to form the potential fixing region 7 may be B ions. Thereafter, the above-mentioned mask is removed.

Figure 21:
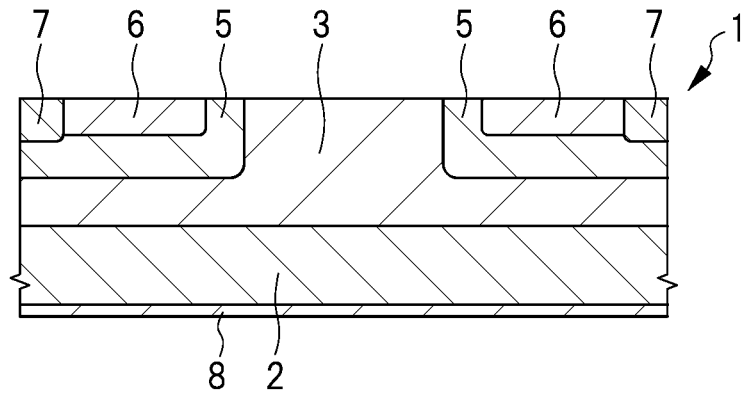
FIG. 21 is a cross-sectional view showing the manufacturing process subsequent to FIG. 20.

Next, as shown in FIG. 21, a drain region 8 which is an n type semiconductor region is formed by implanting N ions into a back surface of the SiC substrate 2. The n type impurity concentration of the drain region 8 is, for example, in the range of $1\times10^{16}$ cm$^{-3}$ to $1\times10^{19}$ cm$^{-3}$. Further, the ions implanted to form the drain region 8 may be P ions.

In this modification, the process of forming the minimal configuration capable of operating the MOSFET will be described, but a structure for adding a function such as a termination region may be formed.

Next, though not shown, a carbon film as a cap material configured to cover a circumference of the SiC wafer 1 composed of the SiC substrate 2 and the epitaxial layer 3 is deposited, and then, the impurity activation annealing is performed at the temperature of, for example, 1600 to 1800° C. Then, the carbon film is removed by the oxygen plasma ashing. Thereafter, in order to obtain a cleaner surface, a thermally oxidized film may be formed and then removed by using diluted hydrofluoric acid solution.

Figure 22:
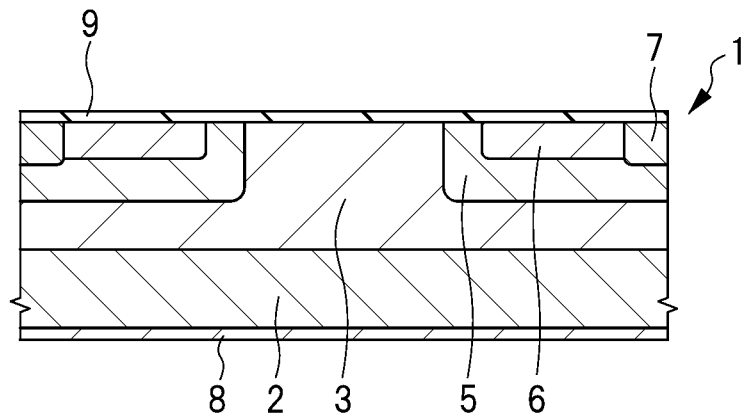
FIG. 22 is a cross-sectional view showing the manufacturing process subsequent to FIG. 21.

Next, as shown in FIG. 22, a gate insulating film 9 is formed on the epitaxial layer 3. In the present embodiment, a deposited oxide film having a thickness of about 10 to 100 nm is formed by using, for example, the CVD (Chemical Vapor Deposition) method.

Figure 23:
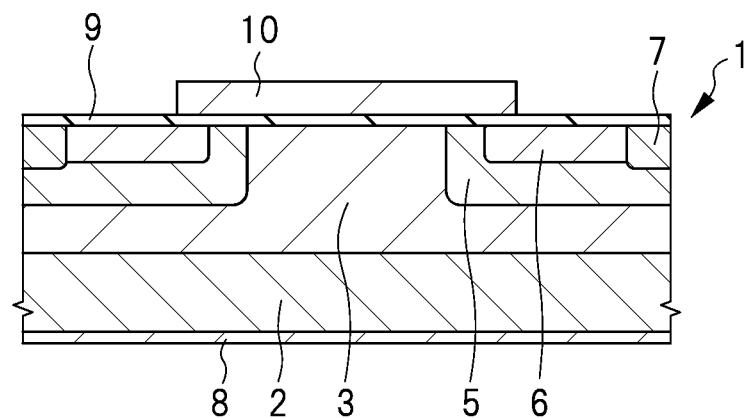
FIG. 23 is a cross-sectional view showing the manufacturing process subsequent to FIG. 22.

Next, as shown in FIG. 23, a gate electrode 10 made of an n type polycrystalline silicon film having a thickness of about 100 to 300 nm is deposited on the epitaxial layer 3. The gate electrode 10 can be formed by forming the silicon film by the CVD method or the like and then patterning the silicon film. The upper surfaces of the source region 6 and the potential fixing region 7 are exposed from the gate electrode 10. In this manner, the MOSFET including the gate electrode 10, the source region 6, and the drain region 8 is formed.

Figure 24:
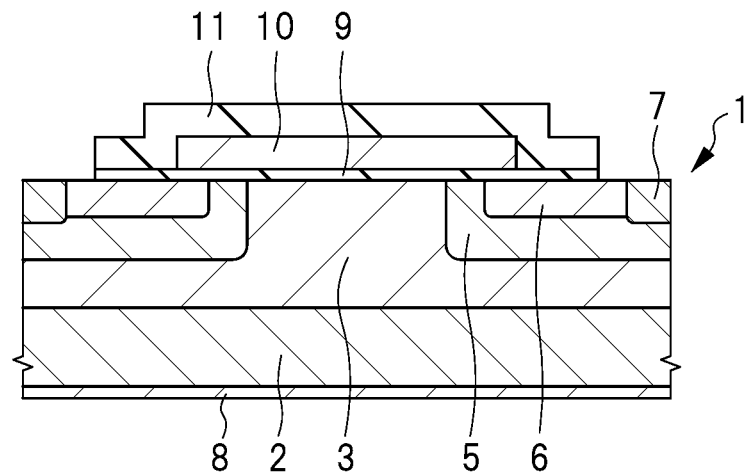
FIG. 24 is a cross-sectional view showing the manufacturing process subsequent to FIG. 23.

Next, as shown in FIG. 24, an interlayer film (interlayer insulating film) 11 that covers the gate electrode is formed. The interlayer film 11 can be formed by forming a silicon oxide film by the CVD method or the like on the gate electrode 10 and then pattering the silicon oxide film. By the patterning, a contact hole exposing each upper surface of the source region 6 and the potential fixing region 7 is formed.

Figure 25:
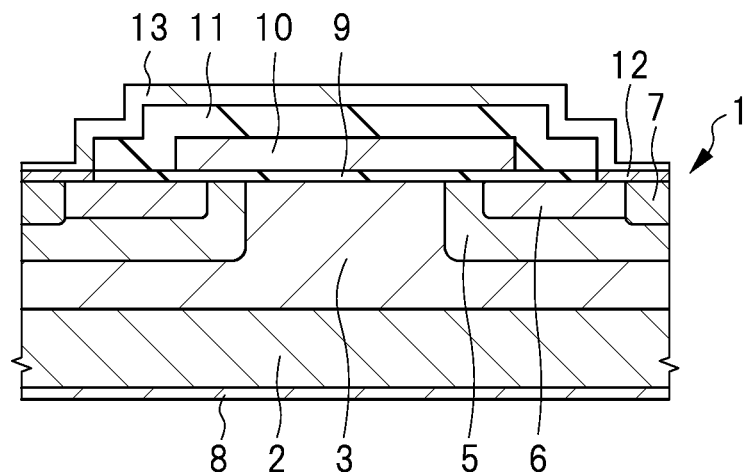
FIG. 25 is a cross-sectional view showing the manufacturing process subsequent to FIG. 24.

Next, as shown in FIG. 25, a silicide layer 12 is formed on each of the source region 6 and the potential fixing region 7 such that the $n^+$ type source region 6 and the $p^+$ type potential fixing region 7 can be electrically conducted. Namely, a metal film for silicidation is deposited on the epitaxial layer 3 and is then silicided by, for example, the annealing treatment at 700° C. to 1000° C. As a result, the silicide layer 12 as a source-base common connection portions is formed. Thereafter, the interlayer film is etched to form a gate contact hole in a region not shown in order to secure the electrical conduction to the gate electrode.

Subsequently, a source electrode 13 that covers the interlayer film 11 and the silicide layer 12 is formed on the epitaxial layer 3. The source electrode 13 is electrically connected to the source region 6 and the potential fixing region 7 via the silicide layer 12.

Figure 26:
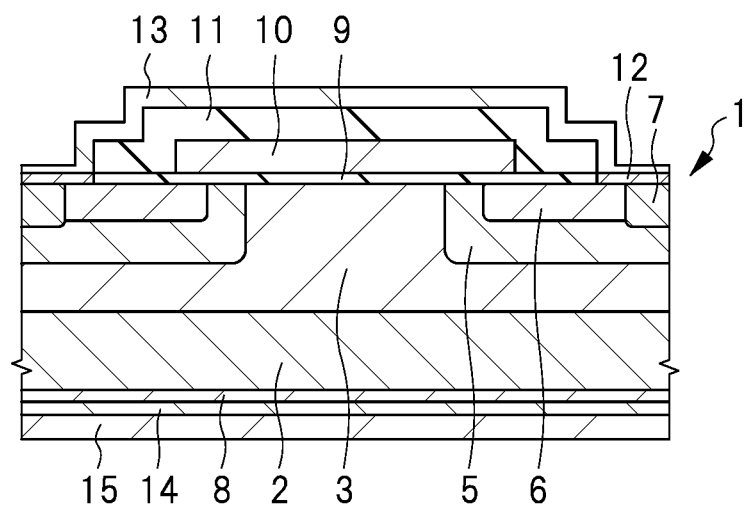
FIG. 26 is a cross-sectional view showing the manufacturing process subsequent to FIG. 25.
Figure 27:
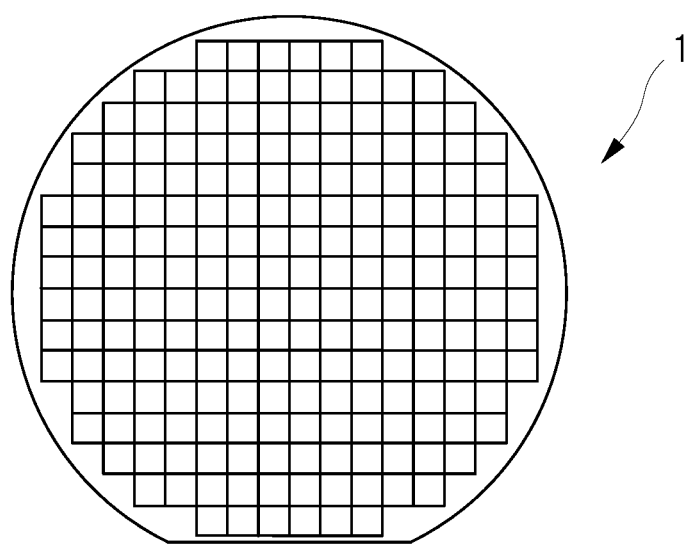
FIG. 27 is a plan view showing the manufacturing process of the DMOSFET on the SiC wafer according to the modification of the first embodiment.

Next, as shown in FIG. 26, a lower surface of the drain region 8 is silicided to form a silicide layer 14. Then, a drain contact electrode 15 is formed under the silicide layer 14. A metal material such as Ni (nickel) or Al is used for each of the metal film for silicidation, the source electrode 13, and the drain contact electrode 15. Thereafter, the semiconductor device is completed through the step of forming a surface protection film made of an insulator on the upper surface of the SiC wafer 1 for device protection and the step of laying the wiring to each electrode. As a result, the SiC wafer shown in FIG. 27 is obtained. Chip regions arranged in matrix in a plan view are formed on the SiC wafer. A plurality of semiconductor chips can be obtained from the SiC wafer by cutting between the chip regions by the dicing step.

In the MOSFET formed in this modification, the carbon-rich layer is formed on the upper surface of the epitaxial layer 3 in contact with the gate insulating film 9. Accordingly, it is possible to extend the time (lifetime) that elapses before the dielectric breakdown of the gate insulating film 9 between the gate electrode 10 and the epitaxial layer 3 occurs. Further, it is also possible to make uniform the characteristics such as the lifetime of the gate insulating film of the elements formed in each of the chip regions arranged in matrix on the circular SiC wafer, and the occurrence of the characteristic variation can be prevented. Therefore, it is possible to improve the reliability of the SiC wafer and to improve the product yield.

The case where the carbon-rich layer (see FIG. 3) is formed at the time after the epitaxial layer is formed and before the p body region is formed has been described here. However, the time when the carbon-rich treatment is performed is not limited to this, and the carbon-rich treatment may be performed at any time as long as it is after the epitaxial layer constituting the outermost surface of the SiC wafer is formed and before the gate insulating film is formed.

Note that, in the case where a trench-gate MOSFET is formed, a trench is formed in an upper surface of an epitaxial layer, and then, a gate electrode is buried in the trench via a gate insulating film. In this case, the carbon-rich treatment is performed after the trench is formed and before the gate insulating film is formed.

Second Embodiment

The carbon-rich treatment can be realized also by a method of oxidizing the surface of the SiC wafer having the epitaxial layer and then removing the oxide film thus formed, by using the solution such as hydrofluoric acid or the like.

FIG. 28 is a graph showing the composition ratios of the C—Si bond and the bonds containing carbon other than the C—Si bond on each of the upper surfaces of the SiC wafer before the carbon-rich treatment, the SiC wafer on which the oxidation treatment at 1300° C. is performed and the oxide film is then removed, and the SiC wafer on which the oxidation treatment at 1150° C. is performed and the oxide film is then removed. In FIG. 28, the graphs in the case before the carbon-rich treatment, the graphs in the case where the oxidation treatment is performed at 1300° C., and the graphs in the case where the oxidation treatment is performed at 1150° C. are arranged in order from the right to the left. Namely, FIG. 28 shows the comparison of the surface composition ratios of the respective SiC wafers obtained by performing the oxidation treatment at each temperature of 1150° C. and 1300° C. under the dried oxygen atmosphere so as to form an oxide film having a thickness of about 50 nm and then removing the oxide film by hydrofluoric acid. In FIG. 28, the composition ratio of the C—Si bond is shown by a white bar graph, and the bar graph of the sum of the composition ratios of the bonds containing carbon other than C—Si is hatched.

As shown in FIG. 28, in the case where the oxidation treatment is performed at 1300° C., the composition ratio of the C—Si bond is reduced and the composition ratio of the bonds containing carbon other than the C—Si bond is increased as compared with the case before the carbon-rich treatment. Also, in the case where the oxidation treatment is performed at 1150° C., the composition ratio of the C—Si bond is reduced and the composition ratio of the bonds containing carbon other than the C—Si bond is increased as compared with the case where the oxidation treatment is performed at 1300° C.

Namely, it is important to perform the oxidation at lower temperature in order to reduce the composition ratio of the C—Si bond.

In the foregoing, the invention made by the inventors has been concretely described based on the embodiments. However, it is needless to say that the present invention is not limited to the above-described embodiments and various modifications can be made without departing from the gist of the present invention.

What is claimed is:
1. A SiC wafer comprising:
   a SiC single crystal substrate;
   a buffer layer made of SiC and formed on the SiC single crystal substrate; and an epitaxial layer formed on the buffer layer and containing SiC, wherein a composition ratio of C—Si bonds of an upper surface of the epitaxial layer is 50 atm % or less, wherein the epitaxial layer is single crystal, and wherein a composition ratio of C—O bonds of the upper surface of the epitaxial layer is 3.6 atm % or more.

2. A SiC wafer comprising:

a SiC single crystal substrate;

a buffer layer made of SiC and formed on the SiC single crystal substrate; and an epitaxial layer formed on the buffer layer and containing SiC, wherein a composition ratio of C—Si bonds of an upper surface of the epitaxial layer is 50 atm % or less, wherein the epitaxial layer is single crystal, and wherein a composition ratio of C—O bonds of the upper surface of the epitaxial layer is 10 atm % or more.

3. A manufacturing method of a SiC wafer comprising:

(a) preparing a SiC single crystal substrate;

(b) forming a buffer layer made of SiC and formed on the SiC single crystal substrate;

(c) forming an epitaxial layer on the buffer layer and containing SiC; and (d) modifying a composition of an upper surface of the epitaxial layer, thereby setting a composition ratio of C—Si bonds of the upper surface of the epitaxial layer to 50 atm % or less, wherein the epitaxial layer is single crystal, and wherein, after the (d), a composition ratio of C—O bonds of the upper surface of the epitaxial layer is 3.6 atm % or more.

4. The manufacturing method of the SiC wafer according to claim 3, wherein, after the (d), a sum of composition ratios of bonds containing carbon other than the C—Si bonds is larger than the composition ratio of the C—Si bonds in the upper surface of the epitaxial layer.

* * * * *